(12) United States Patent
Ziomek

(10) Patent No.: US 7,352,203 B1
(45) Date of Patent: Apr. 1, 2008

(54) METHOD TO REDUCE POWER IN ACTIVE SHIELD CIRCUITS THAT USE COMPLEMENTARY TRACES

(75) Inventor: Jason Ziomek, Columbia, MD (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/616,102

(22) Filed: Dec. 26, 2006

(51) Int. Cl.
*H03K 19/00* (2006.01)

(52) U.S. Cl. ............................................. 326/8; 340/500
(58) Field of Classification Search ................ 326/8, 326/38, 56, 82–86; 340/500, 568.2
See application file for complete search history.

(56) References Cited

U.S. PATENT DOCUMENTS

| | | | |
|---|---|---|---|
| 4,593,384 A | 6/1986 | Kleijne | |
| 4,684,931 A | 8/1987 | Parks | |
| 4,691,350 A | 9/1987 | Kleijne et al. | |
| 4,807,284 A | 2/1989 | Kleijne | |
| 5,635,862 A | 6/1997 | Abramson et al. | |
| 5,642,061 A | 6/1997 | Gorny | |
| 5,675,319 A | 10/1997 | Rivenberg et al. | |
| 6,246,970 B1 | 6/2001 | Silverbrook et al. | |
| 6,396,400 B1 | 5/2002 | Epstein, III et al. | |
| 6,646,565 B1 | 11/2003 | Fu et al. | |
| 6,774,790 B1 | 8/2004 | Houston | |
| 2005/0223152 A1 | 10/2005 | Sugaware | |
| 2006/0250239 A1 | 11/2006 | Melton | |
| 2007/0040256 A1* | 2/2007 | Tuyls et al. | ............... 257/679 |

* cited by examiner

*Primary Examiner*—Don Le
(74) *Attorney, Agent, or Firm*—Schneck & Schneck; Thomas Schneck

(57) ABSTRACT

The present invention provides a method and apparatus for securing an integrated circuit. A pair of conductive security traces are arranged on an integrated circuit. Driver means provide complementary HIGH and LOW voltage levels to a respective first end of each of the conductive security traces. A first switch means temporarily interrupts the driver means and isolates the pair of conductive security traces. A second switch means temporarily connects the first ends of the isolated pair of conductive security traces to each other so that both conductive traces are at the same voltage. The voltage at the first end of one of the security traces at the LOW voltage is then boosted to one-half of the HIGH voltage level (VDD/2) by the HIGH (VDD) voltage level at the first end of the other security trace. First and second comparators are provided, each of which compares voltages on their respective first ends of the pair of conductive security traces with voltages on a respective second end of the pair of conductive security traces. Means are provided for logically combining the output signals of the first and second comparators.

15 Claims, 3 Drawing Sheets

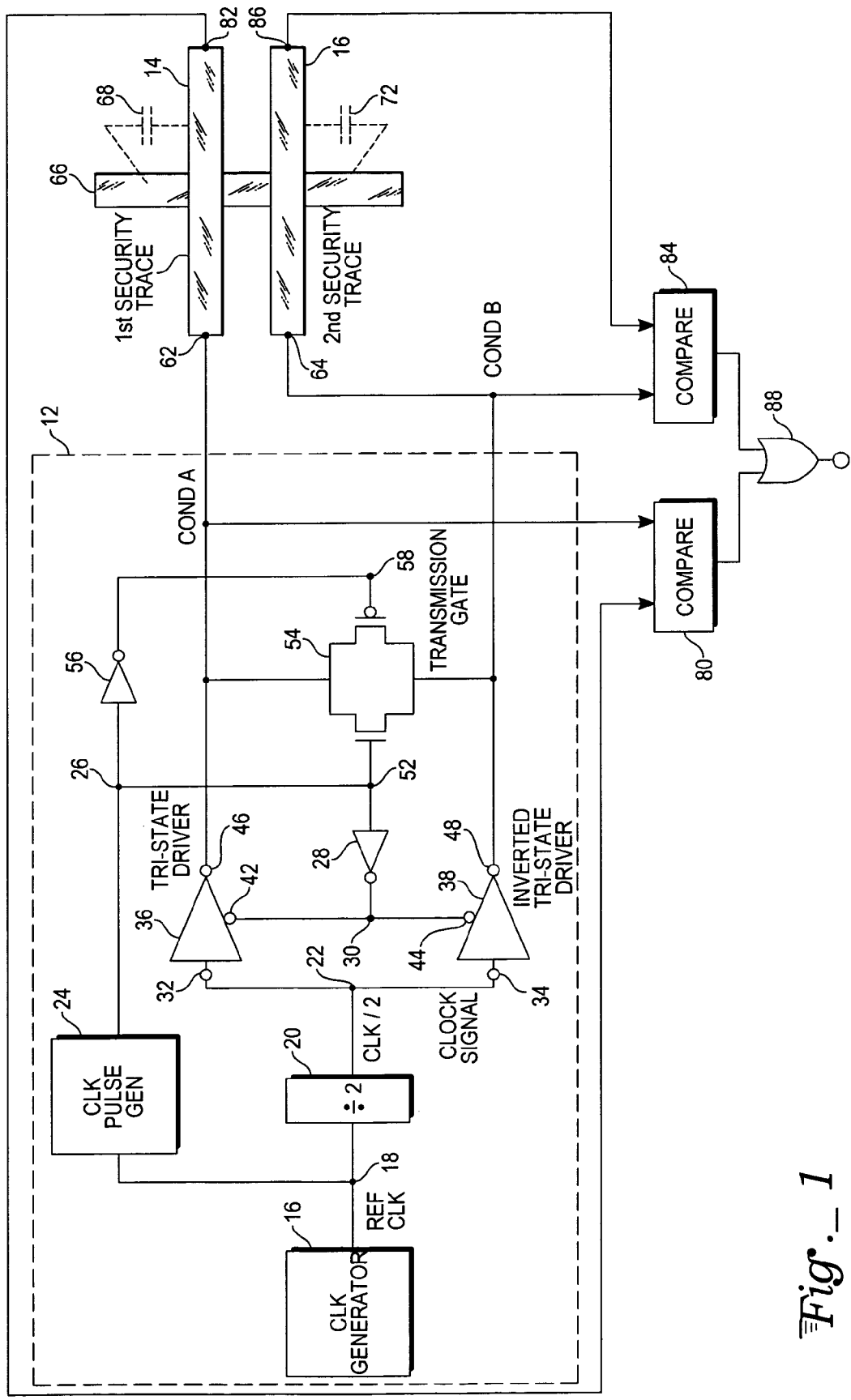
Fig._1

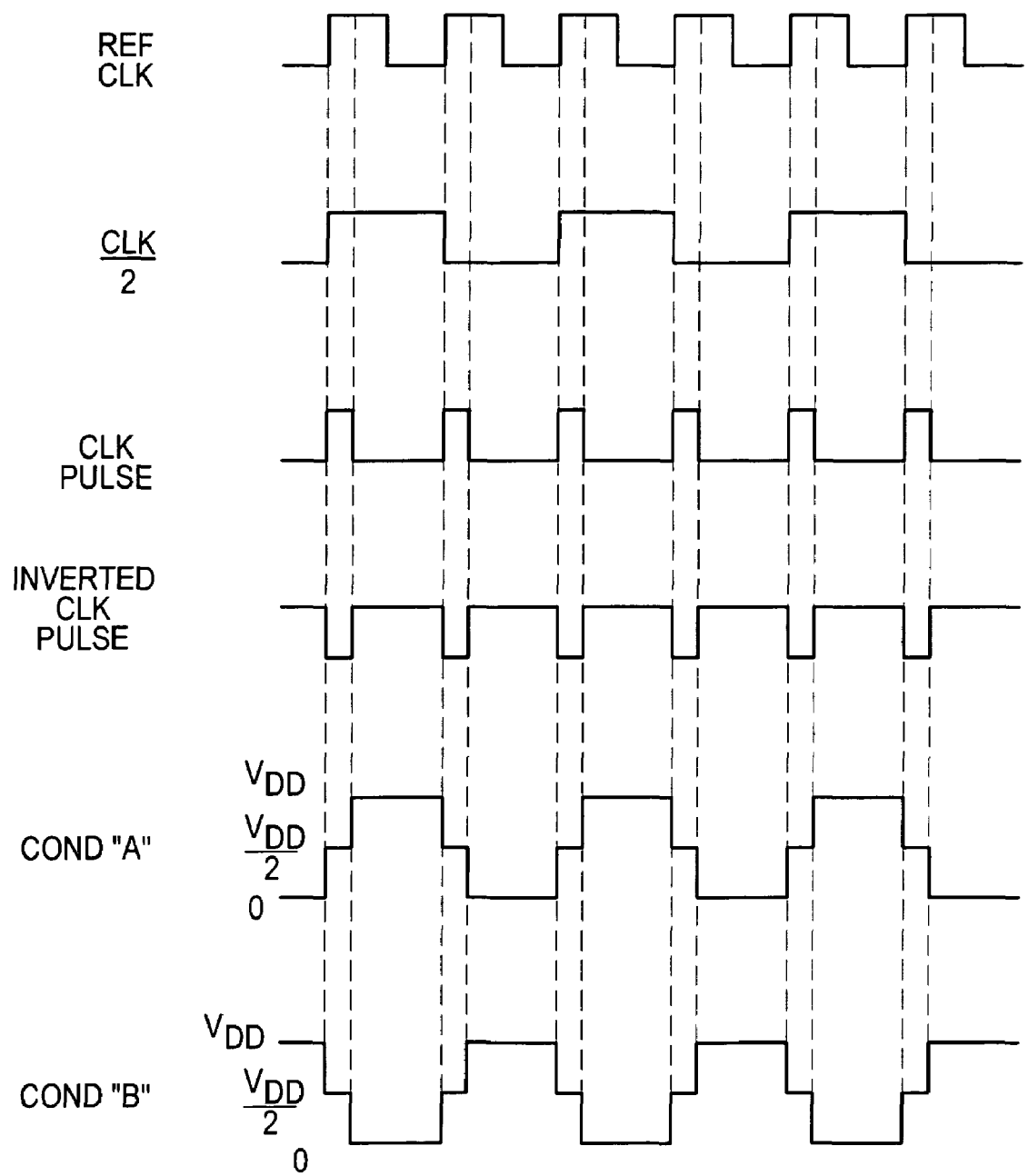
Fig._2

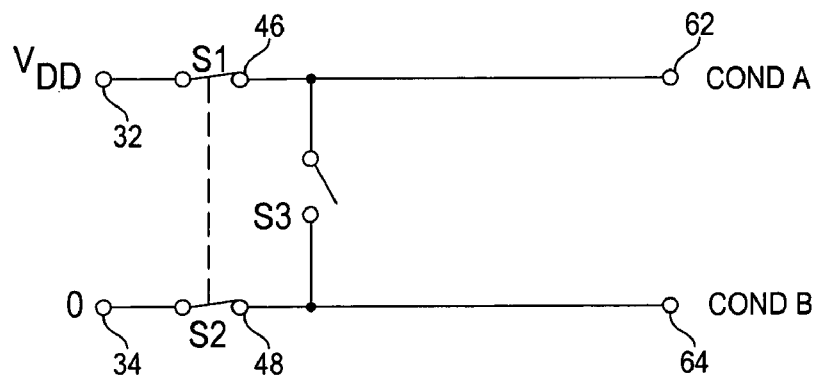
*Fig._3A*
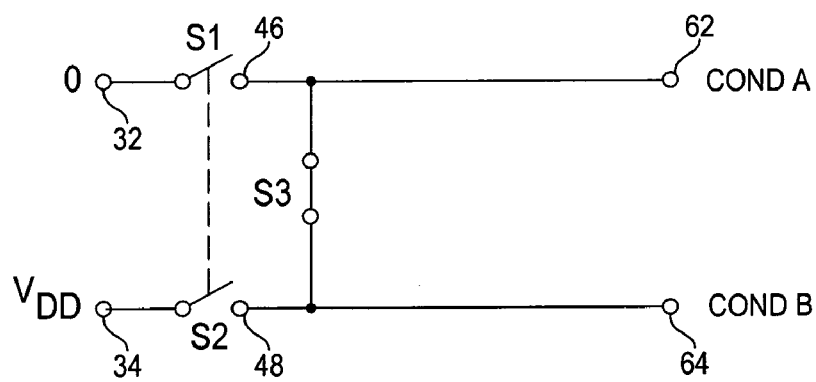
*Fig._3B*
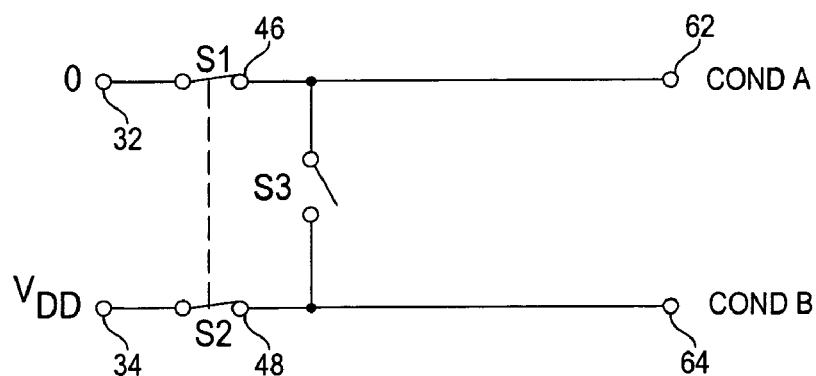
*Fig._3C*

METHOD TO REDUCE POWER IN ACTIVE SHIELD CIRCUITS THAT USE COMPLEMENTARY TRACES

TECHNICAL FIELD

This invention relates to security for an integrated circuit and, more particularly, to an improved energy-efficient driver circuit for a pair of security traces embedded in an IC.

BACKGROUND ART

Various techniques are used to provide security for data and software in an integrated-circuit. Data typically are entered by a customer into a bank terminal using a touchpad or a magnetic card reader. Entered data are then processed to make a secure transaction. Security is a necessity for such transactions and external access to the data must be denied. Therefore, to ensure that the data are not tampered with, stolen, or otherwise accessed without authorization, the data are commonly encrypted prior to transmission. However, data or software could still be accessed prior to encryption, such as, for example, by accessing the traces of an integrated circuit (IC) through which the unencrypted data are first sent. Integrated-circuit traces could be accessed by direct contact with the integrated-circuit traces, or by electronic surveillance techniques, such as decoding voltage on a lead by measuring electromagnetic changes, such as, induced magnetic fields, capacitance, etc.

In some secure integrated-circuit chips, a top-level conducting trace layer is added which consists of one or more signal nets routed in such a way as to obscure the underlying circuitry. This top-level conducting trace layer visually hides the underlying circuit. An optical probe would not be able to provide an image the underlying circuit and from this image develop a means for accessing the circuit. The top-level conducting trace layer prevents physical contact with the circuit such that a physical probe is prevented from contacting a conductive element in the underlying circuit to intercept a signal on that conductor. The top-level conducting trace layer also provides an electromagnetic shield for underlying circuits from interference caused by external electromagnetic signals. The top-level conducting trace layer may also provide an electromagnetic masking signal such that, if a sensitive probe attempts to monitor an electromagnetic signal, the masking signal would frustrate any attempt to intercept any underlying signals in the underlying integrated circuit.

A shield may include an electrical shield component and a conductive component. The conductive component can be actively electrically driven such that any disturbance to the conductive component, such s, for example, drilling through the conductive component or attempted modification to the conductive component, etc., is detected by a security circuit, which can then trigger a specific action, such as sounding an alarm, erasing data or software held by the circuit, etc.

An inherent feature of an active security trace system is that, when the voltage of the security trace layer changes, that change induces a related change in any adjacent conductors through the capacitance between the security trace layer and the adjacent conductors. The changing potential of the security trace causes a current to flow in any adjacent trace via capacitive coupling. A current induced in an adjacent circuit is given by the equation $I=C\, dv/dt$, where I is a current induced, C is the capacitance between adjacent traces, and $dv/dt$ is the time rate of change of the drive voltage.

One type of security technique uses a pattern generator to generate a signal pattern that is driven through a security trace on an integrated circuit. The security trace 14 may be embedded in the packaging of an integrated circuit or otherwise disposed in relation to a lower trace within the integrated circuit. The security trace 14 is connected to a compare circuit that compares the signal generated by the pattern generator 10 to a pattern received from the security trace. As a result of capacitive coupling, there is an unintended electrical coupling of the voltage change in the security trace to the lower trace. Ideally, the lower trace would be unaffected by any voltage change in the security trace. However, due to the unintended coupling through the an unintended coupling capacitor between the traces, there is a dip in the signal as charge carriers migrate to the unintended coupling capacitor. This effect persists until the unintended coupling capacitor is fully charged, at which time there is a recovery to the intended signal strength. Depending upon the particular function of the lower trace, this unintended signal coupling may result in corrupted data, instruction errors, etc. The unintended coupling capacitor represents parasitic capacitance.

A system that compensates for the unintended voltage coupling, such as a differential system, would prevent any distortion of the signals in the underlying circuit.

SUMMARY OF THE INVENTION

The present invention provides a method and apparatus for securing an integrated circuit. An integrated-circuit security apparatus according to the present invention utilizes a clock generator that provides a clock output signal, such as, for example, a square wave. A pair of conductive security traces are arranged on an integrated circuit. Driver means controlled by the clock output signal provide complementary HIGH and LOW voltage levels to a respective first end of each of the conductive security traces. A first switch means temporarily interrupts the driver means and isolates the pair of conductive security traces. A second switch means temporarily connects the first ends of the isolated pair of conductive security traces to each other so that both conductive traces are at the same voltage. The voltage at the first end of one of the security traces at the LOW voltage is then boosted to one-half of the HIGH voltage level (VDD/2) by the HIGH (VDD) voltage level at the first end of the other security trace. This arrangement reduces the amount of power required from the driver circuit that is needed to drive its output terminal from the LOW voltage level to the HIGH voltage level. First and second comparators are provided, each of which compares voltages on their respective first ends of the pair of conductive security traces with voltages on a respective second end of the pair of conductive security traces. Means are provided for logically combining the output signals of the first and second comparators.

The first and the second conductive security traces that receive the complementary HIGH and LOW voltage are each configured to provide for cancellation of any induced voltages in the underlying circuitry of the integrated circuit. The first and the second driver means includes tri-state line drivers having complementary output signals. The second switch means for connecting the first ends of the first and the second security traces together during the signal transitions of the clock generator includes a bidirectional transmission gate.

The present invention provides an integrated circuit security apparatus that includes a pattern generator that provides a patterned output signal. A first conductive security trace and a second conductive security trace that each have respective first and second ends are formed in an integrated circuit substantially parallel to each other. A first driver circuit is driven by the clock generator and has an output terminal which provides a first driver output signal having a HIGH voltage level and a LOW voltage level to a first end of the first security trace. A second driver circuit is driven by the clock generator and provides a second driver output signal to a first end of the second security trace. The second driver output signal is the complement of the first driver output signal and provides a corresponding complementary LOW voltage level and a corresponding complementary HIGH voltage level with respect to the first drive circuit. A first switch means disconnects the output terminals of the first and the second line drivers from the respective first ends of the first and the second security traces during signal transitions of the pattern generator output signal. A second switch means connects the first ends of the first and the second security traces together during the signal transitions of the pattern generator so that the voltage at the first end of one of the security traces at 0 volts is then boosted to one-half of the HIGH voltage level by the HIGH voltage level at the first end of the other security trace to thereby reduce the power required from the driver circuit is to drive its output terminal from the LOW voltage level to the HIGH voltage level. First and second comparators are each configured to compare the respective first and second driver output signals with signals at respective second ends of the first and second conductive security traces. A logic circuit is provided for comparing output signals of the first and the second comparators.

A method of securing an integrated circuit according to the present invention includes the steps of: fabricating a first and a second substantially parallel conductive security trace on an integrated circuit; applying a first signal to one end of the first conductive security trace and applying a second complementary signal to one end of the second conductive trace; temporarily isolating the respective one ends of the conductive security traces; temporarily connecting the first ends of the isolated pair of conductive security traces to each other so that both conductive traces are at the average voltage of the HIGH and LOW voltages so that the voltage at the first end of one of the security traces at the LOW voltage level is then boosted by the HIGH voltage level at the first end of the other security trace to thereby reduce power required from a driver circuit that is to drive its output terminal to the HIGH voltage level; comparing each voltage on the respective first ends of the pair of conductive security traces with voltages on a second end of the pair of conductive security traces; and logically combining output signals of the first and second comparators.

The method also includes configuring the first and the second conductive security traces to cancel any induced voltages in underlying circuitry. The step of applying a first signal to one end of the first and the second conductive security traces and the step of temporarily isolating the respective ones of the conductive security traces include driving the respective first ends of each of the conductive security traces with a respective tri-state line driver. The step of temporarily isolating the respective one ends of the conductive security traces includes placing the respective tri-state line drivers in a high-impedance output state. The step of temporarily connecting the first ends of the isolated pair of conductive security traces to each other includes connecting through a transmission gate.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a circuit diagram of a complementary-output driver circuit for a pair of security traces.

FIG. 2 is a timing diagram for various circuit nodes of FIG. 1.

FIGS. 3A-3C illustrates a switching sequence of a driver circuit according to the present invention.

BEST MODE FOR CARRYING OUT THE INVENTION

FIG. 1 illustrates an integrated-circuit security apparatus 10 having an improved complementary-output driver circuit 12 for a pair of conductive security traces that include a first conductive security trace 14 and a second conductive security trace 16. FIG. 2 is a timing diagram for various circuit terminal nodes of FIG. 1.

With reference to FIGS. 1 and 2, the complementary-output driver circuit 12 includes a clock generator 16 that provides a reference clock signal at an output terminal 18. FIG. 2 illustrates the reference clock (REF CLK) signal as a square wave. However, depending on the requirements of a particular application, the clock signal can have other configurations other than a square wave, such as, for example, an aperiodic signal, a pseudo-random signal, etc.

The complementary-output driver circuit 12 includes a divide-by-two circuit 20 that provides a CLK/2 output signal at node 22. The reference clock signal (REF CLK) at terminal 18 is also applied to an input terminal of the clock pulse generator circuit to provide the clock pulse signal (CLK PULSE) of FIG. 3 at a terminal 26. An inverter provides an inverted clock pulse signal (INVERTED CLK PULSE) at an output terminal 30. The CLK/2 signal at terminal 22 is fed to respective input terminals 32, 34 of a tri-state driver 36 and an inverted tri-state driver 38. The inverted clock pulse signal at terminal 30 is fed to respective tri-state control terminals 42, 44. When a tri-state control signal is active HIGH, the tri-state drivers 36, 38 respectively provide a low-impedance for their respective output terminals 46, 48 for delivering a logic HIGH output signal or a logic LOW output signal, as required. When a tri-state control signal is LOW, the tri-state drivers 36 and the inverted tri-state driver 38 provide a high-impedance for their respective output terminals 46, 48. The respective tri-state control terminals 42, 44 provide means for temporarily interrupting the means for connecting complementary voltages levels, that is, the tri-state driver 36 and the inverted tri-state driver 38, to isolate the pair of conductive security traces from those tri-state drivers.

The clock pulse signal terminal 26 is also connected to an NMOS gate terminal 52 of a bi-directional MOS transmission gate 54. The clock pulse signal terminal is also connected through an inverter 56 to a PMOS gate terminal 58 of the bi-directional MOS transmission gate 54.

The output terminal 46 of the tri-state driver 36 is connected to a first end 62 of the first conductive security trace 14. The output terminal 48 of the inverted tri-state driver 38 is connected to a first end 64 of the second conductive security trace 16. The tri-state driver 36 and the inverted tri-state deriver 38 serve as means controlled by the clock output signal for providing complementary HIGH and LOW output voltage levels to a respective first end 62, 64 of each of the conductive security traces 14, 16.

As illustrated in FIG. 1, the first and second conductive security traces 14, 16 are arranged on a integrated circuit to be parallel to each other. Underlying the first and second conductive security traces 14, 16 is a lower conductive trace 66 that diagrammatically represents one or more conductive regions in the integrated circuit. Unintended coupling between the first conductive security trace 14 and the lower conductive trace 66 is represented by a capacitance 68. Unintended coupling between the second conductive security trace 16 and the lower conductive trace 66 is represented by a capacitance 72.

The bi-directional MOS transmission gate 54 provides a means for temporarily connecting the first ends 62, 64 of the isolated pair of conductive security traces to each other so that, assuming equal capacitance for each signal trace, both conductive traces are at the average voltage of the HIGH and LOW voltages so that the voltage at the first end of one of the security traces at the LOW voltage is then boosted to one-half of the HIGH voltage level by the HIGH voltage level at the first end of the other security trace. If the HIGH voltage is VDD and the LOW voltage is 0 volts, the average voltage is VDD/2. If the capacitances of the traces are not the same, the voltage will be shared proportionately. This reduces power required from the driver circuit that is to drive its output terminal from the LOW voltage level to the HIGH voltage level.

A first comparator 80 has one input terminal connected to the first end 62 of the first conductive security trace 14 and its other input terminal connected to the second end 82 of the first conductive security trace 14. Similarly, a second comparator 84 has one input terminal connected to the first end 64 of the second conductive security trace 16 and its other input terminal connected to the second end 84 of the second conductive security trace 16. Means for logically combining output signals of the first and second comparators 80, 84 are provided, for example, by a NOR gate 88.

FIGS. 3A-3C illustrate a generic switching operation and sequence for the complementary-output driver circuit for a generic pair of conductive security traces designated COND A and COND B that are generic to the conductive security traces 14, 16. Generic switches S1, S2 generically include the tri-state line drivers 36, 38 and have input terminals 32, 34 and output terminals 46, 48. The generic switch S3 includes the bi-directional MOS transmission gate 54.

In FIG. 3A, switch S3 is open and switches S1 and S2 are closed such that the VDD voltage at input terminal 32 is on COND A and V(A)=VDD and such that 0 volts at input terminal 34 is on COND B and V(B)=0.

In FIG. 3B, the input voltages at terminals 32, 34 have changed to 0 volts and VDD volts. The switches S1 and S2 are open and the switch S3 is closed so that the VDD voltage at terminal 62 is connected through S3 to terminal 64. Charge on the capacitance of COND A is transferred to the capacitance of COND B. If the capacitances are equal, V(A)=VDD/2 and V(B)=VDD/2.

In FIG. 3C, the input voltages at terminals 32, 34 remain at 0 volts and VDD volts. The switches S1, S2 are closed and switch S3 is open such that V(A)=0 and V(B)=VDD.

A more generic approach to the concept of the present invention is illustrated in FIGS. 3A-3B. If a logical decision is made to switch the drive signal polarity on conductors A and B, the switches S1 and S2 are opened and the conductors A and B are shorted together through S with S3. At the same time, the signals on terminals 32, 34 are inverted. After a certain time, switches S1 and S2 are closed to provide the inverted signals on terminals 32, 34 to the conductors A and B.

Note that in the embodiment of FIG. 1 the two conductive security traces 14, 16 are strips overlying a representative lower trace 66. Generally, the geometric shapes of the conductive security traces are designed so that the two traces are as close as possible and oriented so that any significantly large signal adjacent to the traces (e.g. on a lower trace layer) has an equal capacitive coupling to both traces of the complimentary pair. The result of this arrangement is a balance in the induced currents so that by using security signals that are substantially complementary in phase and amplitude, any induced currents are substantially canceled out. Circuit characteristics that affect capacitance include: for example, the dielectric constant of the layers between the security traces 14, 16 and the lower trace 66; the distance between the unintended coupling capacitors 68, 72; and the size of the capacitive plates of the unintended coupling capacitors 68, 72.

In summary, an integrated-circuit security apparatus includes a pair of security traces. The security traces are capacitive loads on the complementary output terminals of driver circuits. A user-selected patterned signal, such as a clock signal, drives the complementary-output driver circuit that provides one output signal for one trace and a second complementary output signal for the other trace. The present invention modifies signal transitions for the complementary-output driver circuit. Before a signal transition, one of the security traces will have a VCC voltage on it and the other security trace will be grounded. The first modification provided by the present invention is to provide isolation between a driver circuit output and its respective security trace and vice-versa. Next, the two security traces (one at VDD volts and the other at 0 volts) are shorted together so that each of the security traces has a voltage of VDD/2 across it. Then the short-circuit is removed and one of the security traces is driven by the driver circuit from a boosted level, VDD/2, to VDD while the other security trace is grounded by its driver circuit. This arrangement saves power because the trace to be driven to the full VDD voltage level is already at VDD/2 and needs to be only driven from VDD/2 to VDD by the driver circuit. In effect, the enhancement salvages half of the charge from one security trace at VCC and transfers that charge to the other security trace at VCC/2. This conserves energy from the power supply for the driver circuit.

One skilled in the art will recognize that the essential characteristic of using a security trace pairing arrangement is that the currents induced by the unintentional coupling capacitors 68, 72 to any lower trace 66 substantially cancel each other out. To this end, the range of voltages, trace sizes and trace geometries provide a number of combinations which can be utilized to achieve the desired cancellation. The lower trace 66 is representative, and many lower traces may actually be present in any given application. Therefore, the descriptions contained herein are to be viewed in an illustrative rather than restrictive sense.

The foregoing description of a specific embodiment of the present invention has been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An integrated-circuit security apparatus, comprising:
a pair of conductive security traces that are arranged on an integrated circuit;
driver means controlled by a clock signal for providing complementary HIGH and LOW voltage levels to a respective first end of each of the conductive security traces;
first switch means for temporarily interrupting the driver means and isolating the pair of conductive security traces;
second switch means for temporarily connecting the first ends of the isolated pair of conductive security traces to each other so that both conductive traces are at the same voltage such that the voltage at the first end of one of the security traces at the LOW voltage is boosted to an intermediate voltage level between the complementary HIGH and LOW voltage levels by the HIGH voltage level at the first end of the other security trace to thereby reduce power required from the driver circuit that is to drive its output terminal from the LOW voltage level to the HIGH voltage level;
first and second comparators, each respectively comparing voltages on the respective first ends of the pair of conductive security traces with voltages on a respective second end of the pair of conductive security traces; and
means for logically combining output signals of the first and second comparators.

2. The integrated-circuit security apparatus of claim 1 wherein the first and the second conductive security traces that receive the complementary HIGH and LOW voltage are each configured to provide for cancellation of any induced voltages in the underlying circuitry.

3. The integrated-circuit security apparatus of claim 1 wherein the clock signal is a square wave.

4. The integrated-circuit security apparatus of claim 1 wherein the first and the second driver circuits and the first switch means for disconnecting the output terminals of the first and the second line drivers from the respective first ends of the first and the second security traces during signal transitions of the clock signal includes tri-state line drivers having complementary output signals.

5. The integrated-circuit security apparatus of claim 1 wherein the second switch means for connecting the first ends of the first and the second security traces together during the signal transitions of the clock signal includes a bi-directional transmission gate.

6. An integrated-circuit security apparatus, comprising:
a first conductive security trace and a second conductive security trace that are formed in an integrated circuit and that are substantially parallel to each other and that each have respective first and second ends;
a first driver circuit that is driven by the clock signal and that has an output terminal which provides a first driver output signal to a first end of the first security trace, wherein the first driver output signal provides a HIGH voltage level and a LOW voltage level;
a second driver circuit that is driven by the clock signal and that has an output terminal which provides a second driver output signal to a first end of the second security trace, where the second driver output signal is the complement of the first driver output signal and provides a corresponding complementary LOW voltage level and a corresponding complementary HIGH voltage level with respect to the first drive circuit;
first switch means for disconnecting the output terminals of the first and the second line drivers from the respective first ends of the first and the second security traces during signal transitions of the pattern generator output signal;
second switch means for connecting the first ends of the first and the second security traces together during the signal transitions of the pattern generator so that the voltage at the first end of one of the security traces at 0 volts is then boosted to an intermediate voltage level between the complementary HIGH and LOW voltage levels by the HIGH voltage level at the first end of the other security trace to thereby reduce the power required from the driver circuit is to drive its output terminal from the LOW voltage level to the HIGH voltage level;
a first comparator and a second comparator that are each configured to compare the respective first and second driver output signals with signals at respective second ends of the first and second conductive security traces; and
a logic circuit for comparing output signals of the first and the second comparators.

7. The integrated-circuit security apparatus of claim 6 wherein the first and the second conductive security traces that receive the complementary HIGH and LOW voltages are configured to cancel any induced voltages in the underlying circuitry.

8. The integrated-circuit security apparatus of claim 6 wherein the clock signal is a square wave.

9. The integrated-circuit security apparatus of claim 6 wherein the first and the second driver circuits and the first switch means for disconnecting the output terminals of the first and the second line drivers from the respective first ends of the first and the second security traces during signal transitions of the pattern generator output signal includes tri-state line drivers having complementary output signals.

10. The integrated-circuit security apparatus of claim 6 wherein the second switch means for connecting the first ends of the first and the second security traces together during the signal transitions of the clock signal includes a transmission gate.

11. A method of securing an integrated circuit, comprising the steps of:
providing a first and a second substantially parallel conductive security trace on an integrated circuit;
applying a first signal to one end of the first conductive security trace and applying a second complementary signal to one end of the second conductive trace;
temporarily isolating the respective one ends of the conductive security traces;
temporarily connecting the first ends of the isolated pair of conductive security traces to each other so that both conductive traces are at the average voltage of the HIGH and LOW voltages so that the voltage at the first end of one of the security traces at the LOW voltage level is then boosted by the HIGH voltage level at the first end of the other security trace to thereby reduce power required from a driver circuit that is to drive its output terminal to the HIGH voltage level;
comparing each voltages on the respective first ends of the pair of conductive security traces with voltages on a second end of the pair of conductive security traces; and logically combining output signals of the first and second comparators.

12. The method of claim 11 including configuring the first and the second conductive security traces to substantially cancel any induced voltages in underlying circuitry.

13. The method of claim 11 wherein the steps applying a first signal to one end of the first and the second conductive security traces and the step of temporarily isolating the respective ones of the conductive security traces include driving the respective first ends of each of the conductive security traces with a respective tri-state line driver.

14. The method of claim 12 wherein the step of temporarily isolating the respective one ends of the conductive security traces includes placing the respective tri-state line drivers in a high-impedance output state.

15. The method of claim 11 wherein the step of temporarily connecting the first ends of the isolated pair of conductive security traces to each other includes connecting through a transmission gate.

* * * * *